US012782439B2

(12) United States Patent
Schmidt et al.

(10) Patent No.: US 12,782,439 B2
(45) Date of Patent: Nov. 3, 2026

(54) PREDICTION OF FAILURE PROBABILITIES OF CHIPS OF A WAFER

(71) Applicant: Robert Bosch GmbH, Stuttgart (DE)

(72) Inventors: Eric Sebastian Schmidt, Heimsheim (DE); Stefan Patrick Lindt, Ettlingen (DE)

(73) Assignee: Robert Bosch GmbH, Stuttgart (DE)

( * ) Notice: Subject to any disclaimer, the term of this patent is extended or adjusted under 35 U.S.C. 154(b) by 157 days.

(21) Appl. No.: 18/794,311

(22) Filed: Aug. 5, 2024

(65) Prior Publication Data

US 2025/0052814 A1 Feb. 13, 2025

(30) Foreign Application Priority Data

Aug. 10, 2023 (DE) ..................... 10 2023 207 670.5

(51) Int. Cl.
*G01R 31/3185* (2006.01)

(52) U.S. Cl.
CPC ............................ *G01R 31/318511* (2013.01)

(58) Field of Classification Search
CPC ............ G01R 31/2894; G01R 31/2831; G01R 31/318511; G05B 2219/32194; G05B 19/41875; G05B 2219/45031; G05B 2219/32201; G05B 13/027; G05B 2219/2602; H10P 74/23; H10P 74/203; G06N 20/00
See application file for complete search history.

(56) References Cited

U.S. PATENT DOCUMENTS 5,777,901 A * 7/1998 Berezin ................... H10P 74/23 716/56
2001/0023083 A1* 9/2001 Simmons ................ H10P 74/23 438/22
2005/0288812 A1 12/2005 Cheng et al.
(Continued)

FOREIGN PATENT DOCUMENTS

CN 114397985 A * 4/2022 ........... G06F 3/0481

OTHER PUBLICATIONS

Jang et al., "A Wafer Map Yield Prediction Based on Machine Learning for Productivity Enhancement," in IEEE Transactions on Semiconductor Manufacturing, vol. 32, No. 4, pp. 400-407, Nov. 2019 (Year: 2019).*

(Continued)

*Primary Examiner* — Daniel R Miller
(74) *Attorney, Agent, or Firm* — Maginot, Moore & Beck LLP

(57) ABSTRACT

A method is for teaching a machine learning system to predict failure probabilities of chips on a wafer. The method is based on a prediction of final test yields depending on wafer-level test measurements by the machine learning system. The machine learning system predicts the failure probabilities of the chips depending on the wafer-level test measurements, and the predicted failure probabilities are aggregated to the predicted final test yields. The machine learning system is trained, such that a math difference between predicted final test yields and final test yields from a training data set is minimized. Differences between the predicted final test yields and final test yields from a training data set are minimized.

9 Claims, 1 Drawing Sheet

(56) References Cited

U.S. PATENT DOCUMENTS

2015/0066467 A1 3/2015 Acar et al.

OTHER PUBLICATIONS

H. Selg, M. Jenihhin and P. Ellervee, “Wafer-Level Die Re-Test Success Prediction Using Machine Learning,” 2020 IEEE Latin-American Test Symposium (LATS), Maceio, Brazil, 2020, pp. 1-5 (Year: 2020).*

P. Lenhard, A. Kovalenko and R. Lenhard, “Integrated Circuit Die Level Yield Prediction Using Deep Learning,” 2022 33rd Annual Semi Advanced Semiconductor Manufacturing Conference (ASMC), Saratoga Springs, NY, USA, 2022, pp. 1-6 (Year: 2022).*

Laura Peters, Improving Yield With Machine Learning, Jul. 12, 2022, available at https://semiengineering.com/improving-yield-with-machine-learning/ (Year: 2022).*

* cited by examiner

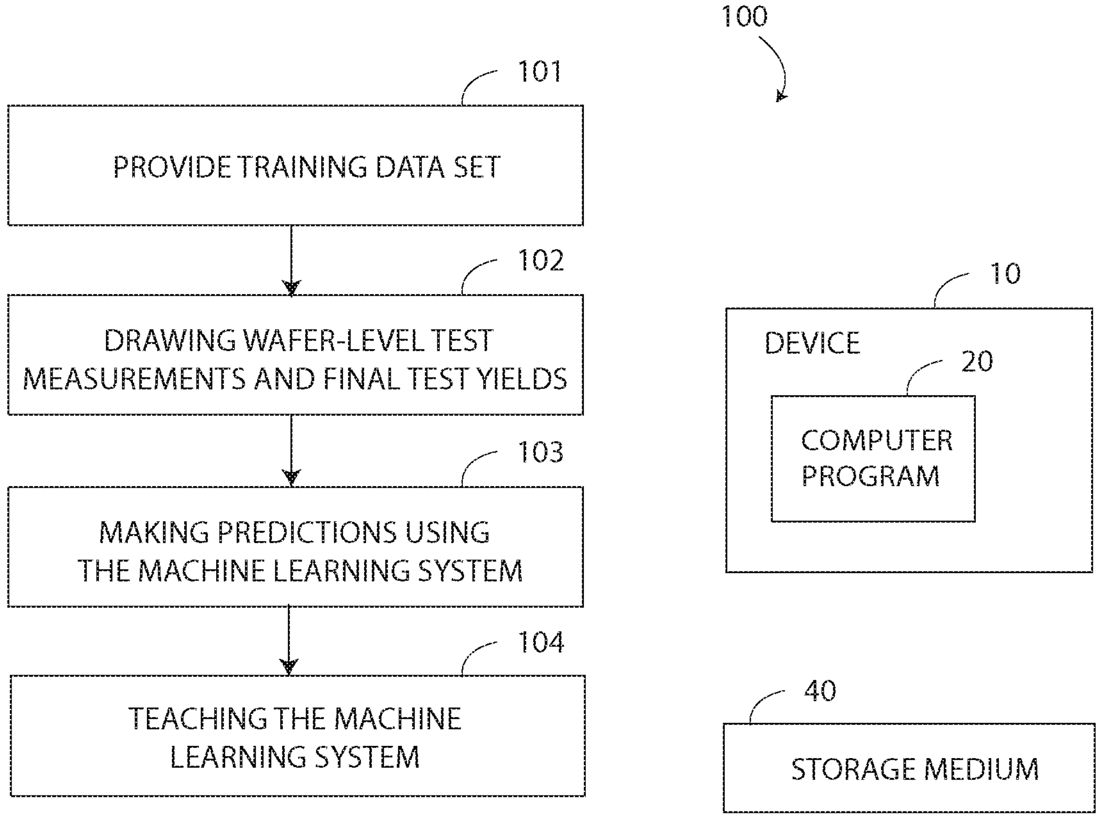
100
101
PROVIDE TRAINING DATA SET
102
DRAWING WAFER-LEVEL TEST MEASUREMENTS AND FINAL TEST YIELDS
103
MAKING PREDICTIONS USING THE MACHINE LEARNING SYSTEM
104
TEACHING THE MACHINE LEARNING SYSTEM
10
DEVICE
20
COMPUTER PROGRAM
40
STORAGE MEDIUM

PREDICTION OF FAILURE PROBABILITIES OF CHIPS OF A WAFER

This application claims priority under 35 U.S.C. § 119 to patent application no. DE 10 2023 207 670.5, filed on Aug. 10, 2023 in Germany, the disclosure of which is incorporated herein by reference in its entirety.

The disclosure relates to a method for teaching a machine learning system for predicting failure probabilities of chips on a wafer and a method for predicting failure probabilities of the chips with the taught machine learning system.

BACKGROUND

It is generally known that machine learning (ML for short) and machine learning methods can be suitable for predicting defects in components during production.

Currently, predicting the failure probability or defect probability of an individual semiconductor chip during final testing based on wafer level test measurements is not possible due to the loss of traceability between processes. In particular, the link between a single chip for which wafer-level measurements have been performed and the associated final test is lost after the wafer has been cut, making the training of supervised models impossible.

It is therefore a task of the disclosure to provide a prediction of the probability of an individual chip being defective based on test measurements at wafer level.

SUMMARY

By predicting the failure probability, chips with a high failure probability can be removed early in the manufacturing process or, depending on the failure probabilities of all chips in a batch, an intelligent combination of chips in the end product with a low failure probability of the end product can be determined.

As a result, the disclosures can reduce waste, rework and additional costs associated with manufacturing and shipping defective products. By detecting and eliminating defects at an early stage, manufacturers can improve product quality and reduce the reject rate.

In a first aspect, the disclosure relates to a method for teaching a machine learning system to predict failure probabilities of the chips on a wafer during final-level testing or, in particular, later during operation of the chips.

The method begins by providing a training data set comprising wafer-level test measurements and an associated final test yield of a plurality of wafers. The final test yield can be understood as a quotient of the number of chips on the wafer that have passed the final test compared to the total number of chips on the wafer tested in the final test.

The following steps are then repeated several times:

- drawing a preferably complete wafer-level lot of wafer-level test measurements and the associated FT lot of final test yields, especially for an iteration/batch.
- predictions of the final test yields depending on the wafer-level test measurements by the machine learning system, wherein the machine learning system predicts the failure probabilities of the chips depending on the wafer-level test measurements and the predicted failure probabilities are aggregated to the predicted final test yields.
- teaching of the machine learning system in such a way that a mathematical difference between the predicted final test yield and the assigned final test yield is minimized.

What is surprising here is that the actually simplified training task of yield prediction is used to learn during training which chips will have a high or low failure probability and this essentially corresponds to the actual failure probability on a validation data set.

The disclosure of the first aspect can be used to color defective chips at an early stage of the manufacturing process, so that the chip cannot be further processed or removed after the dicing process (=cutting out the individual chips from the wafer). Another application is using the failure probability to perform smart sorting, where chips with a high failure probability are packaged together, reducing the risk of multiple good chips being packaged with a single bad chip, resulting in the elimination of the entire package.

It is also conceivable within the scope of the disclosure that the assignment of the components to the functional units comprises a sorting into at least two or three different classes according to the probability of the failure or defect occurring.

Furthermore, it is advantageous if, within the scope of the disclosure, the components are combined into the functional units by the assignment in such a way that the components are combined into the functional units depending on their class, so that preferably each of the functional units has only the components of the same class. This increases the likelihood that the entire functional unit will comprise more than one defective component when it is sorted out and, in particular, disposed of. Alternatively or additionally, it is possible that the assignment of the components to the functional units is carried out in such a way that the components are combined depending on their probability of failure in the functional unit, so that preferably the probability is maximized that in the case of a failed functional unit more than one defective component in the functional unit is responsible for this failure.

Another object of the disclosure is a computer program, in particular a computer program product, comprising instructions which, when the computer program is executed by a computer, cause the computer to carry out the method according to the disclosure. The computer program according to the disclosure thus brings with it the same advantages as have been described in detail with reference to a method according to the disclosure.

The disclosure also relates to a device for data processing which is configured to carry out the method according to the disclosure. The device can be a computer, for example, that executes the computer program according to the disclosure. The computer can comprise at least one processor for executing the computer program. A non-volatile data memory can be provided as well, in which the computer program can be stored and from which the computer program can be read by the processor for execution.

An object of the disclosure can also be a computer-readable storage medium comprising the computer program according to the disclosure. The storage medium is configured as a data memory such as a hard drive and/or a non-volatile memory and/or a memory card, for example. The storage medium can, for example, be integrated into the computer.

In addition, the method according to the disclosure can also be designed as a computer-implemented method.

BRIEF DESCRIPTION OF THE DRAWINGS

Further advantages, features and details of the disclosure will emerge from the following description, in which embodiment examples of the disclosure are described in detail with reference to the drawings. The features mentioned in the claims and in the description can each be essential to the disclosure individually or in any combination. Shown are:

The FIGURE is a schematic visualization of a method, a device, a storage medium and a computer program according to embodiment examples of the disclosure.

DETAILED DESCRIPTION

In the manufacture of semiconductor wafers, the wafers are tested after various production steps. Before the wafer is broken down into individual chips and the chips are packaged into the end product, the "finished" wafers are tested in what is known as wafer-level testing or EWS (=Electrical Wafer Sorting). In this step, the position of the individual chips on the wafer is still known.

After dicing and packaging, the wafers are tested again in the so-called final test. Since the position of the wafers is lost after the dicing process, it is no longer possible to trace the chips back to their original coordinates, which makes the training of supervised machine learning models impossible. Even if the individual chip position of each chip is lost, the information as to which wafer as a whole is part of the test lot is still available.

In the following, a method is proposed that enables the prediction of failure probability in the final inspection of individual chips based on wafer-level measurements.

For this purpose, a neural network architecture is used that receives a series of wafer-level measurements of a wafer as input and predicts a failure probability for each chip on the wafer (e.g. by using a sigmoid activation function in the last layer). For each matching set of wafers and final inspection lots, an average of the chip predictions can be calculated to obtain a yield of chips on the wafer.

For this purpose, the neural network is trained so that it can predict a yield of chips after the final test. The training is carried out as shown in the FIGURE.

According to embodiment examples of the disclosure, the FIGURE illustrates a method 100 for teaching a machine learning system, in particular a neural network, to predict failure probabilities of chips on a wafer. Also shown is a computer program 20, a storage medium 40 and a device 10 for data processing according to embodiment variants of the disclosure.

The method 100 begins by providing 101 a training data set comprising wafer-level test measurements at the chip level and an associated final test yield of a plurality of wafers.

The subsequent steps are then carried out several times until a predefined termination criterion is met:

- drawing 102 of a plurality of wafer-level test measurements and assigned final test yields,
- predictions 103 of the final test yields depending on the wafer-level test measurements by the machine learning system, wherein the machine learning system predicts the failure probabilities of the chips depending on the wafer-level test measurements and the predicted failure probabilities are aggregated to the predicted final test yields.

The drawn wafer level measurements are processed as input by the machine learning system, in particular propagated through the neural network to obtain a failure probability for each chip.

All failure probabilities are then aggregated to a single lot yield (e.g. by using the average).

- teaching 104 of the machine learning system in such a way that a mathematical difference between the predicted final test yield and the assigned final test yield is minimized. Teaching can be done using known training methods based on errors between predicted and true final test lot yields.

After training, the neural network can be used to predict a failure probability for each chip in the final test.

What is claimed is:

1. A method for teaching a machine learning system to predict failure probabilities of chips on a wafer, comprising:
- providing a training data set comprising wafer-level test measurements for each wafer of a plurality of wafers and an associated wafer-level final test yield for each wafer of the plurality of wafers;
- repeating several times:
  - drawing a plurality of wafer-level test measurements and associated wafer-level final test yields of the training data set,
  - predicting predicted wafer-level final test yields based on the drawn plurality of wafer-level test measurements using the machine learning system,
  - using the machine learning system to determine the failure probability of each of the chips on each wafer of the plurality of wafers based on the drawn plurality of wafer-level test measurements,
  - aggregating the determined failure probabilities to the predicted wafer-level final test yields, and
  - teaching the machine learning system to minimize a mathematical difference between the predicted wafer-level final test yield and the associated wafer-level final test yield for each wafer of the plurality of wafers,
- wherein the machine learning system is a neural network and an activation function of an output layer of the neural network is a sigmoid activation function.

2. The method according to claim 1, wherein the machine learning system has a topography set up to record the drawn plurality of wafer-level test measurements as an input variable and to output the failure probabilities as an output variable for each chip on the wafer of the plurality of wafers.

3. The method according to claim 1, further comprising:
- performing the aggregation of the determined failure probabilities to the predicted wafer-level final test yields using an average calculation of the determined failure probabilities.

4. The method according to claim 1, wherein a computer program comprises instructions which, when the computer program is executed by a computer, cause the computer to execute the method.

5. The method according to claim 1, wherein:
- the associated wafer-level final test yield for each wafer of the plurality of wafers is a ratio of a number of the chips of the respective wafer that pass a final test to a total number of the chips of the respective wafer tested in the final test, the final test being performed after the respective wafer has been diced into individual chips,
- the training data set does not identify, for any individual chip of any wafer of the plurality of wafers, whether the individual chip passed or failed the final test, and
- the associated wafer-level final test yields are the only results of the final test included in the training data set.

6. A method for determining failure probabilities of chips on a wafer, comprising:
- using a trained machine learning system according to claim 1 to determine a failure probability in a final test for each chip on the wafer depending on wafer-level test measurements of a currently processed wafer.

7. The method according to claim 6, wherein the chips for which the determined failure probability is greater than a predetermined first threshold value are sorted out and/or those chips for which the determined failure probability is less than a predetermined second threshold value are installed with other chips less than the predetermined second threshold value in a final product.

8. A device for data processing configured to carry out the method according to claim 1.

9. A non-transitory computer-readable storage medium comprising instructions which, when executed by a computer, cause the computer to execute the method according to claim 1.

* * * * *